United States Patent
Wu et al.

(10) Patent No.: US 8,759,894 B1
(45) Date of Patent: Jun. 24, 2014

(54) SYSTEM AND METHOD FOR REDUCING CROSS-COUPLING NOISE BETWEEN CHARGE STORAGE ELEMENTS IN A SEMICONDUCTOR DEVICE

(75) Inventors: Yider Wu, Panchiao (TW); Hiroyuki Ogawa, Sunnyvale, CA (US); Unsoon Kim, San Jose, CA (US); Angela T. Hui, Fremont, CA (US)

(73) Assignees: Spansion LLC, Sunnyvale, CA (US); Globalfoundries Inc., Grand Cayman (KY)

( * ) Notice: Subject to any disclaimer, the term of this patent is extended or adjusted under 35 U.S.C. 154(b) by 2471 days.

(21) Appl. No.: 11/189,765

(22) Filed: Jul. 27, 2005

(51) Int. Cl.
*H01L 29/78* (2006.01)

(52) U.S. Cl.
USPC ........................... 257/314; 257/E29.3

(58) Field of Classification Search
USPC ................ 257/315, 316, 314, E29.3
See application file for complete search history.

(56) References Cited

U.S. PATENT DOCUMENTS 6,642,570 B2 * 11/2003 Tseng .......................... 257/315
7,151,295 B2 * 12/2006 Yaegashi et al. ............. 257/316

OTHER PUBLICATIONS

2002 IEEE International Solid-State Circuits Conference, Session 6, "SRAM and Non-Volatile Memories," Feb. 4, 2004, 6 pages.
2002 IEEE International Solid-State Circuits Conference, 23 pages.

* cited by examiner

*Primary Examiner* — Matthew W Such
*Assistant Examiner* — Monica D Harrison
(74) *Attorney, Agent, or Firm* — Harrity & Harrity, LLP

(57) ABSTRACT

A memory device is provided including a substrate. A first dielectric layer is formed over the substrate. An isolation trench is formed in a portion of the substrate and the first dielectric layer. At least two charge storage elements are formed over the first dielectric layer on opposite sides of the isolation trench. A second dielectric layer is formed over the at least two charge storage elements. A control gate layer is formed over the second dielectric layer, where the isolation trench has a width suitable for reducing cross-coupling noise of charge storage elements, and where the at least two charge storage elements have a height suitable for providing sufficient gate coupling between the at least two charge storage elements and the control gate layer.

13 Claims, 7 Drawing Sheets

SYSTEM AND METHOD FOR REDUCING CROSS-COUPLING NOISE BETWEEN CHARGE STORAGE ELEMENTS IN A SEMICONDUCTOR DEVICE

TECHNICAL FIELD

The present invention relates generally to semiconductor manufacturing and, more particularly, to fabrication of memory devices.

BACKGROUND ART

Conventional semiconductor flash or block erase Electrically Erasable Programmable Read-Only Memory (Flash EEPROM) devices include arrays of cells that can be independently programmed and read. The size of each cell and thereby the memory device are made small by omitting transistors known as select transistors that enable the cells to be erased independently. As a result, a group of the cells are erased together as a block.

Flash memory devices of this type may include individual memory cells characterized by a vertical stack of a tunnel oxide (e.g., $SiO_2$), a polysilicon floating gate over the tunnel oxide, an interlayer dielectric over the floating gate, and a control gate over the interlayer dielectric. The vertical stack may be formed on a crystalline silicon substrate. The substrate may include a channel region positioned below the vertical stack and source and drain on opposing sides of the channel region. Various voltages may be applied to the cell elements to program the cell with a binary 1 or 0, to erase all or some of the cells as a block, to read the cell, to verify that the cell is erased, or to verify that the cell is not over-erased.

Another type of memory cell structure is characterized by a vertical stack that includes an insulating tunnel oxide layer, a charge trapping nitride layer, an insulating top oxide layer, and a polysilicon control gate, all positioned on top of a crystalline silicon substrate. This particular structure of a silicon channel region, tunnel oxide, nitride, top oxide, and polysilicon control gate is often referred to as a SONOS (silicon-oxide-nitride-oxide-silicon) device.

It is known that as capacitive coupling between the charge storage layer and the control gate of a conventional stacked-gate memory cell is increased, the time taken to programming the cell is decreased. In general, capacitive coupling may be increased by increasing the capacitance, through an increase in the areas of the floating and control gate electrodes. However, because of the continued downscaling of semiconductor memory devices in general, the cell area, and hence the areas of the gate electrodes are necessarily being reduced. As a result, it has been difficult to maintain the suitable coupling levels.

Memory cells in a flash memory device are typically connected in an array of rows and columns, with the control gates of the cells in a row being connected to a respective word line and the drains of the cells in a column being connected to a respective bit line. To operate efficiently and reliably, each cell is effectively isolated from neighboring cells.

Unfortunately, conventional shallow trench isolation (STI) fabrication techniques fail to provide stacked cell structures that provide sufficient gate coupling while simultaneously reducing or eliminating deleterious cross-coupling noise between neighboring charge storage elements.

DISCLOSURE OF THE INVENTION

In an implementation consistent with the principles of the invention, a memory device is provided. The memory device includes a substrate. A first dielectric layer is formed over the substrate. An isolation trench is formed in a portion of the substrate and the first dielectric layer. At least two charge storage elements are formed over the first dielectric layer on opposite sides of the isolation trench. A second dielectric layer is formed over the at least two charge storage elements. A control gate layer is formed over the second dielectric layer, where the isolation trench has a width suitable for reducing cross-coupling of charge storage elements, and where the at least two charge storage elements have a height suitable for providing sufficient gate coupling between the at least two charge storage elements and the control gate layer.

In another implementation consistent with the principles of the invention, a method for forming a semiconductor device is provided. The method includes forming a first dielectric layer over a substrate; forming a charge storage layer over the first dielectric layer, wherein the charge storage layer has a height ranging from about 100 Å to about 300 Å; forming at least one isolation trench within the substrate, first dielectric layer, and charge storage layer thereby forming at least two charge storage elements, wherein the at least one isolation trench has a width between neighboring charge storage elements ranging from about 300 Å to about 1000 Å; forming an inter-gate dielectric layer over the semiconductor device; and forming a control gate layer over the intergate dielectric layer.

In yet another implementation consistent with the principles of the invention, a memory device is provided. The memory device includes a tunnel oxide layer formed over a substrate. A charge storage layer is formed over the tunnel oxide layer. An isolation trench is formed in a portion of the substrate, the isolation trench forming two charge storage elements on opposite sides of the isolation trench, where the isolation trench width is less than the isolation trench height.

BRIEF DESCRIPTION OF THE DRAWINGS

The accompanying drawings, which are incorporated in and constitute a part of this specification, illustrate an embodiment of the invention and, together with the description, explain the invention. In the drawings.

BEST MODE FOR CARRYING OUT THE INVENTION

The following detailed description of implementations consistent with the principles of the invention refers to the accompanying drawings. The same reference numbers in different drawings may identify the same or similar elements. Also, the following detailed description does not limit the invention. Instead, the scope of the invention is defined by the appended claims and their equivalents.

Figure 1:
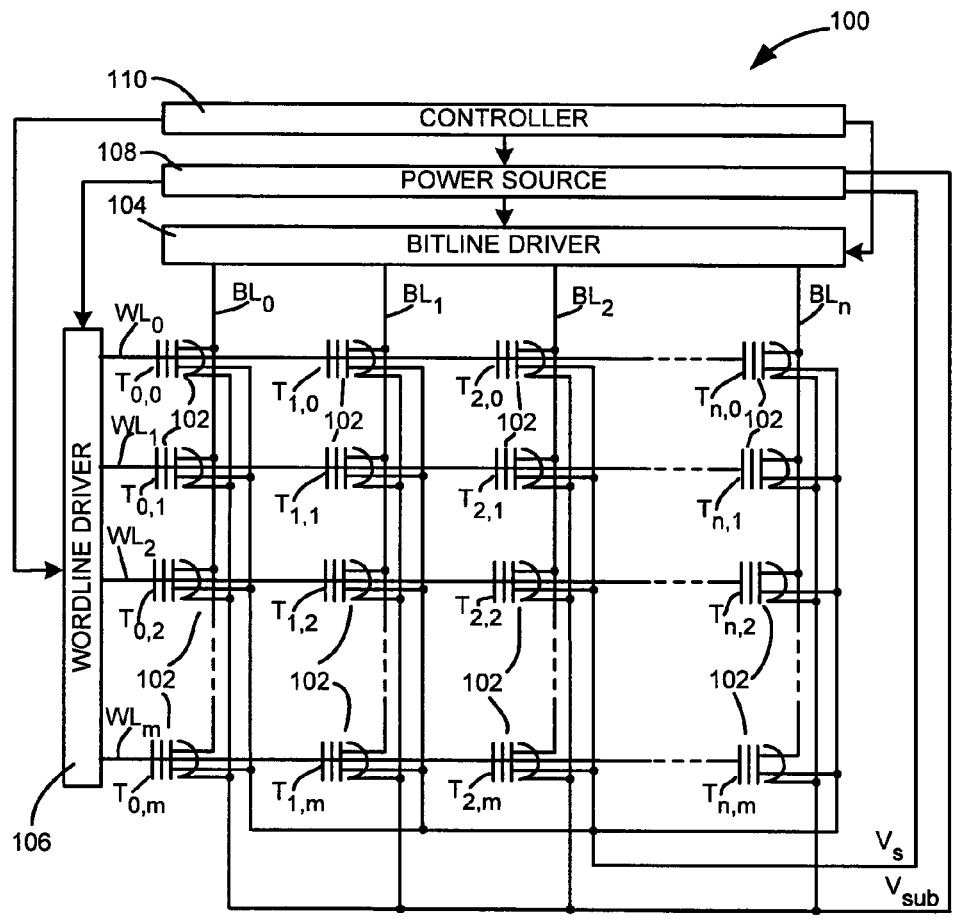
FIG. 1 illustrates an exemplary configuration of a flash EEPROM 100 formed in accordance with an embodiment of the invention.

Implementations consistent with principles of the invention provide non-volatile memory devices having improved field oxide mesa widths, such as flash electrically erasable programmable read only memory (EEPROM) devices. FIG. 1 illustrates an exemplary configuration of a flash EEPROM 100 formed in accordance with an embodiment of the invention. Flash memory 100 may include a plurality of memory cells 102, arranged in a rectangular matrix or array of rows and columns, a plurality of bit lines (BL) associated with each column, a plurality of word lines (WL) associated with each row, a bit line driver 104, a word line driver 106, a power source 108 and a controller 110.

Assuming that there are n columns and m rows in EEPROM 100, the bit lines may be designated as $BL_0$ to $BL_n$ and the word lines may be designated as $WL_0$ to $WL_m$. Accordingly, there may be n+1 bit lines and m+1 word lines. Bit line driver 104 applies appropriate voltages to the bit lines. Similarly, appropriate voltages are applied to the word lines by word line driver 106. The voltages applied to drivers 104 and 106 may be generated by a power source 108 under the control of a controller 110, which may include on-chip logic circuitry. Controller 110 may also control drivers 104 and 106 to address the memory cells individually or collectively.

A memory cell 102 is located at each junction of a word line and a bit line. In one implementation, each cell 102 includes a Metal-Oxide-Semiconductor (MOS) Field Effect Transistor (FET) having a source and drain formed in a semiconductor substrate, a floating gate, and a control gate separated from the floating gate by an intergate dielectric. Additional details regarding the formation of cell 102 will be described below in relation to FIGS. 2-11. As should be appreciated, the cells of a flash EEPROM differ from conventional FETs in that they include the floating gate and tunnel oxide layer disposed between the control gate and the semiconductor substrate in which the source and drain are formed.

Cells 102 illustrated in FIG. 1 may be designated using the notation $T_{i,j}$, where j is the row (word line) number and i is the column (bit line) number. The control gates of cells 102 are connected to respective word lines, and the drains of cells 102 are connected to respective bit lines as illustrated. The sources of all of the cells are connected to power source 108.

In addition to a core memory array, as described above, a flash memory device may also include a peripheral microcontroller circuit formed on a portion of the flash memory device adjacent the core memory array. A number of transistors may be used in the peripheral circuit to provide the voltage required to program/erase the core memory cells.

Exemplary Processing

Figure 2:
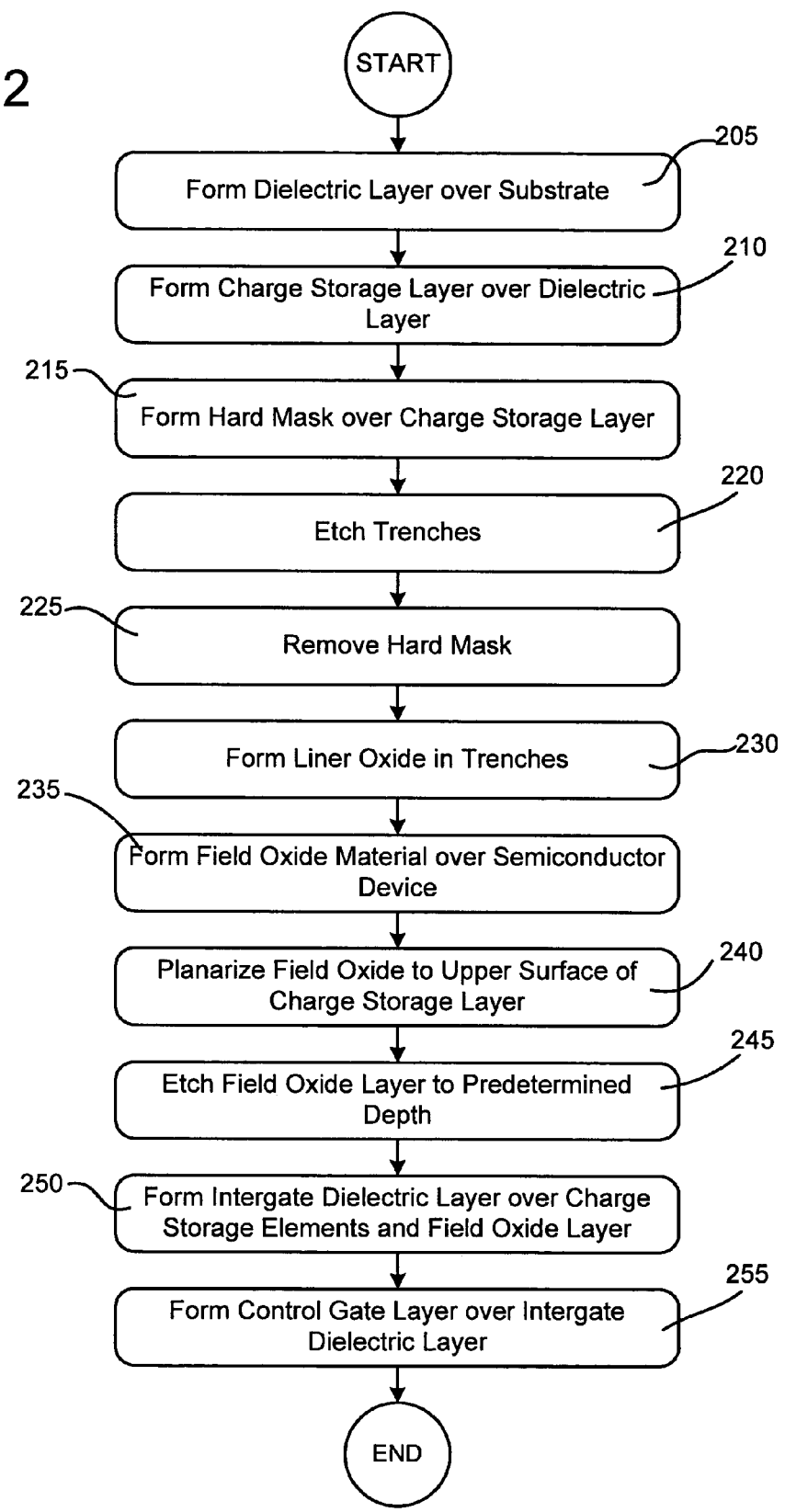
FIG. 2 is a flow diagram illustrating an exemplary process for forming a semiconductor memory device in an implementation consistent with the principles of the invention.

FIG. 2 illustrates an exemplary process for forming a semiconductor memory device in an implementation consistent with the principles of the invention. In one implementation, the semiconductor memory device includes an array of memory cells of a flash memory device, such as that illustrated in FIG. 1. FIGS. 3-11 illustrate exemplary views of a semiconductor memory device fabricated according to the processing described in FIG. 2.

Figure 3:
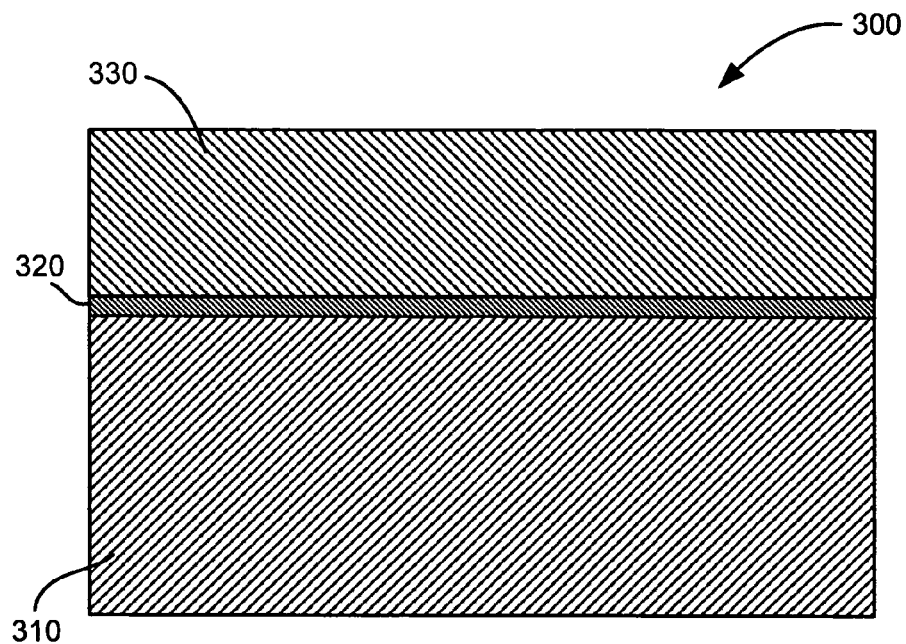
FIGS. 3-11 illustrate exemplary views of a semiconductor memory device fabricated according to the processing described in FIG. 2.

With reference to FIGS. 2 and 3, processing may begin with a semiconductor device 300 that includes layers 310, 320, and 330. In an exemplary embodiment, layer 310 may include a substrate of semiconductor device 300 and may include silicon, germanium, silicon-germanium or other semiconducting materials. In alternative implementations, layer 310 may be a conductive layer or a dielectric layer formed a number of layers above the surface of a substrate in semiconductor device 300.

Layer 320 may be dielectric layer formed on layer 310 in a conventional manner (act 205). In an exemplary implementation, dielectric layer 320 may include an oxide, such as a silicon oxide (e.g., $SiO_2$), and may have a thickness ranging from about 30 Å to about 100 Å. Dielectric layer 320 may function as a tunnel oxide layer for a subsequently formed memory cell of semiconductor device 300. In one implementation consistent with principles of the invention, a suitable method for forming layer 320 may be thermal oxidation of layer 310 at a temperature ranging from about 750° C. to about 1100° C. Alternatively, layer 320 may be deposited using a low pressure chemical vapor deposition (LPCVD) process performed at a temperature of about 400° C. to 800° C.

Layer 330 may be formed on layer 320 in a conventional manner and may act as a charge storage or floating gate layer for semiconductor device 300 (act 210). In an exemplary implementation, layer 330 may include a silicon, such as polycrystalline silicon ("polysilicon"). For a SONOS type memory cell, layer 330 may include a nitride, such as silicon nitride (e.g., $Si_3N_4$). Layer 330 may have a thickness ranging from about 35 Å to about 1000 Å. In one specific embodiment, layer 330 is a polysilicon layer having a thickness of about 900 Å. It should be understood that the thickness of layer 330 is suitable to provide sufficient gate coupling effects between charge storage layer 330 and a subsequently formed control gate layer. In one implementation consistent with principles of the invention, a suitable method for forming layer 330 may be chemical vapor deposition (CVD), although suitable alternative deposition techniques may also be employed.

Figure 4:
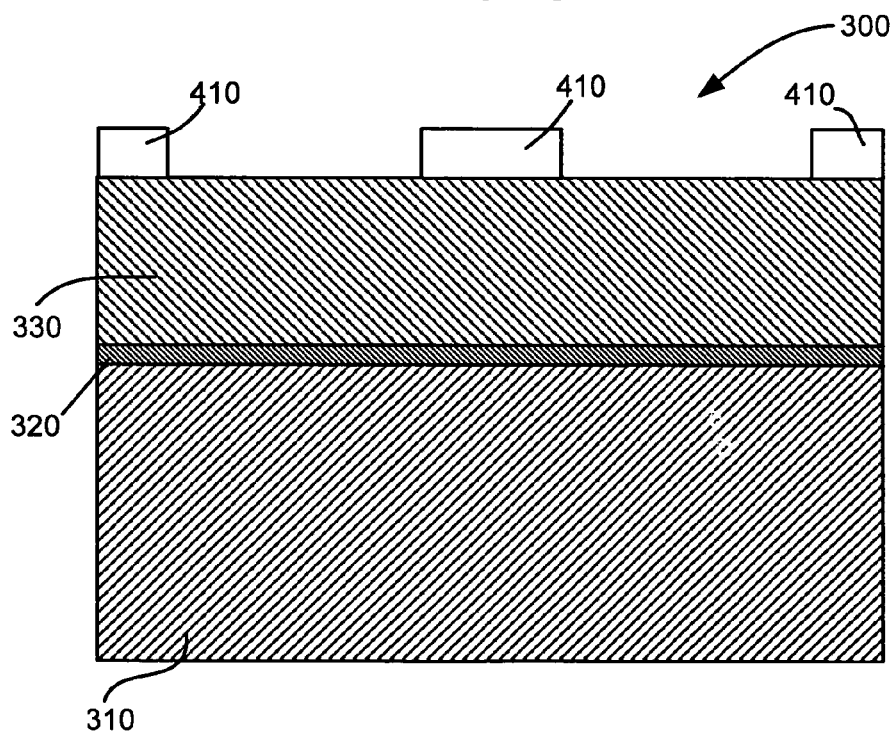

Following formation of layer 330, a photoresist material may be patterned and etched to form a hard mask 410 over layer 330, as illustrated in FIG. 4 (act 215). Hard mask 410 may be used to define active regions in the subsequently formed memory device and indicate areas that will not be etched during formation of core isolation regions in semiconductor device 300. In an exemplary implementation, hard mask 410 may include a nitride, such as silicon nitride (e.g., $Si_3N_4$), and may have a width ranging from about 1000 Å to about 3000 Å and a thickness ranging from about 500 Å to about 1000 Å. In one specific embodiment, hard mask 410 may be a silicon nitride mask having a width of about 2000 Å. In accordance with principles of the invention, the width of hard mask 410 is such that trenches formed using the mask have a sufficient width to reduce or eliminate cross-coupling effects between adjacent charge storage elements in the completed memory device.

Figure 5:
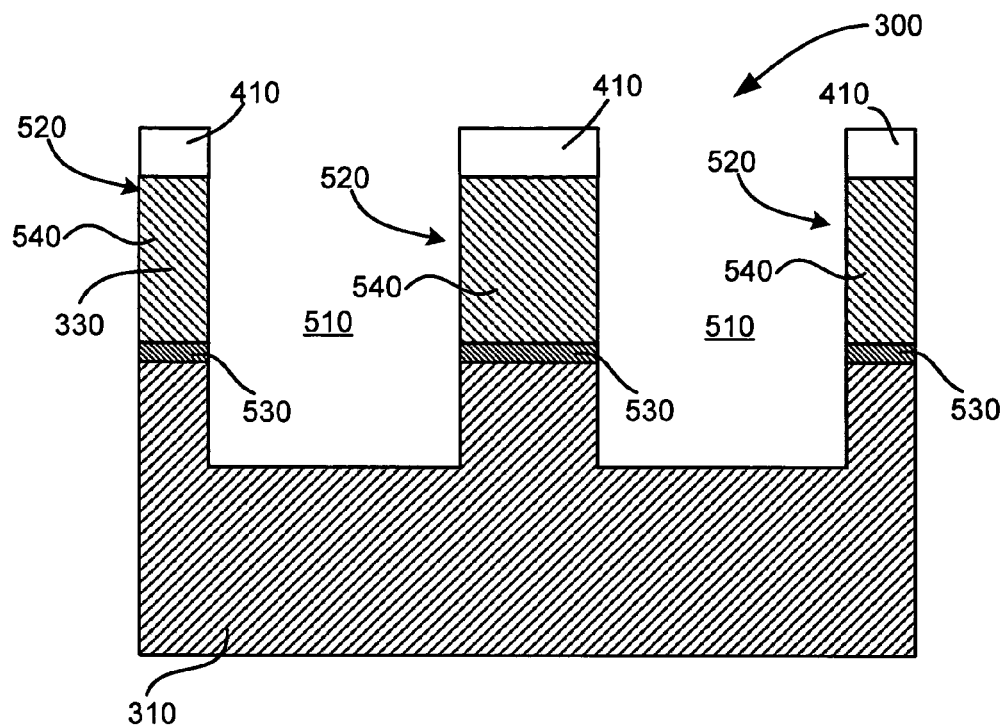
Figure 6:
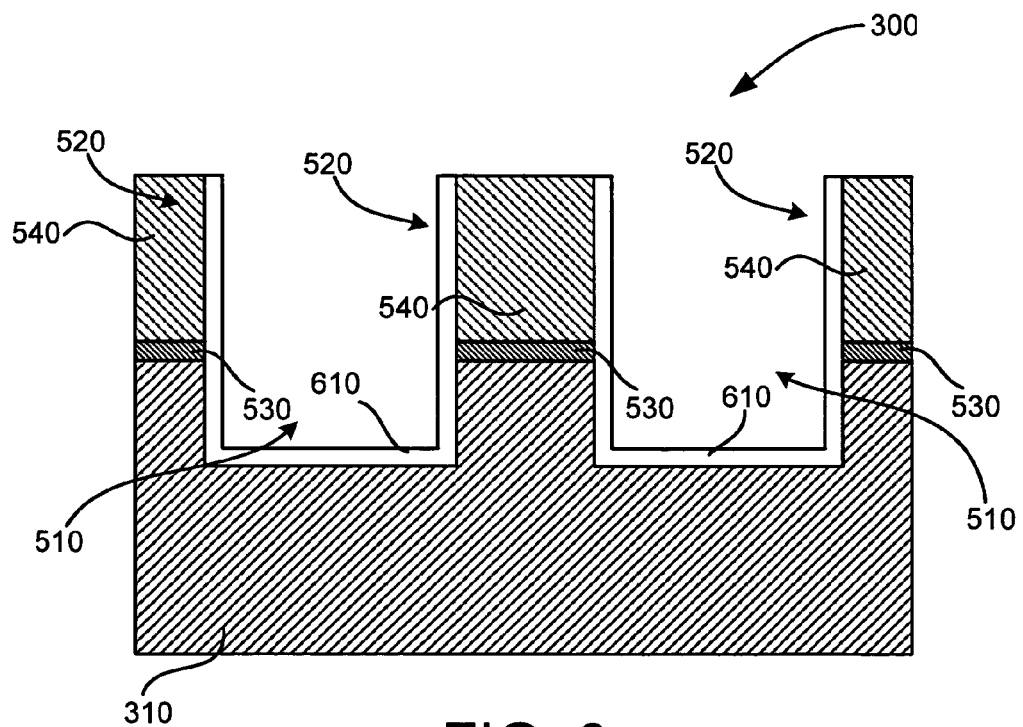

Following formation of hard mask 410, semiconductor device 300 may then be etched, as illustrated in FIG. 5, to remove portions of substrate 310, dielectric layer 320, and charge storage layer 330 thereby forming shallow trenches 510 (act 220). In one exemplary implementation, shallow trenches 510 may have a width ranging from about 2000 Å to about 3000 Å and a height in substrate 310 ranging from about 1000 Å to about 3000 Å. Remaining portions of layers 320 and 330 form memory cell stacks 520, each stack 520 having a tunnel oxide element 530 and a charge storage element 540. In one exemplary implementation, charge storage element 540 includes a nitride material having a width ranging from about 1000 Å to about 3000 Å and a height ranging from about 30 Å to about 100 Å. The etching to form trenches 510 may also be referred to as a shallow trench isolation (STI) etch. Hard mask 410 may then be removed (or cleaned), as illustrated in FIG. 6 (act 225). In accordance with principles of exemplary ratios of trench 510 width to charge storage element 540 height may range from about 20:3 to about 30:1, thereby resulting in the subsequently formed memory devices having reduced cross-coupling noise while simultaneously exhibiting suitable gate coupling properties.

In accordance with one implementation consistent with principles of the invention, once hard mask 410 has been removed, a liner oxide layer 610 may be formed within trenches 510 in a conventional manner, as shown in FIG. 6

(act 230). In one exemplary implementation, liner oxide layer 610 may include an oxide, such as a silicon oxide (e.g., $SiO_2$), and may have a thickness ranging from about 200 Å to about 500 Å. In one implementation consistent with principles of the invention, a suitable method for forming liner oxide layer 610 may be a thermal oxidation process at a temperature of about 950° C. to 1100° C.

Figure 7:
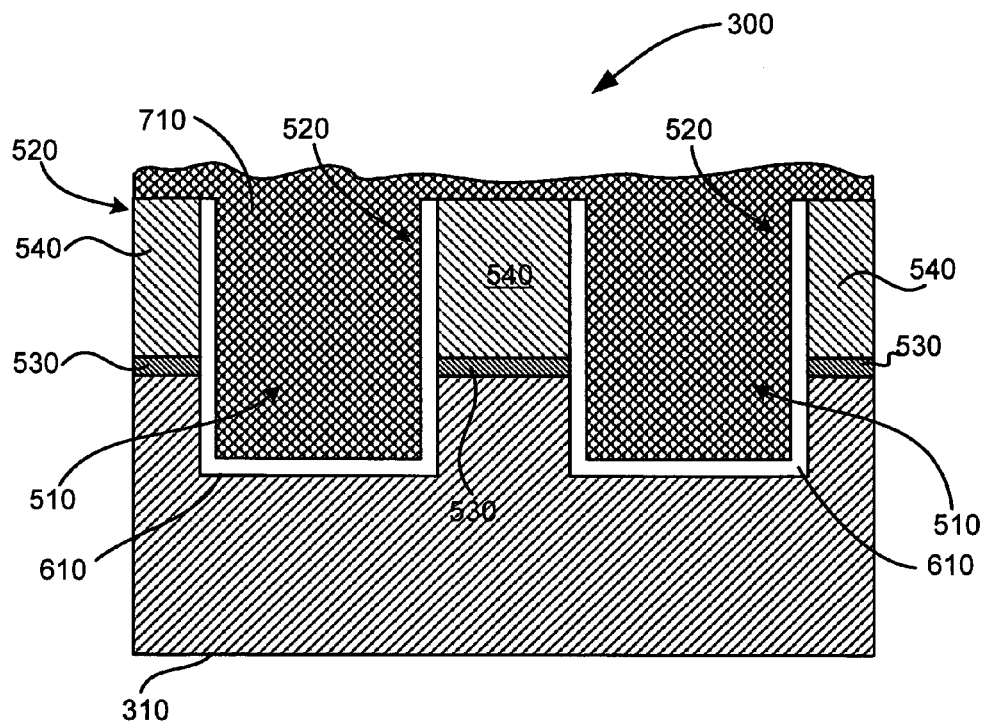

A field oxide (FOX) material 710 may be formed on semiconductor device 300, as illustrated in FIG. 7 (act 235). In one implementation consistent with principles of the invention, FOX layer 710 may be deposited by high density plasma chemical vapor deposition (HDP CVD), although suitable alternative deposition techniques may also be employed.

Figure 8:
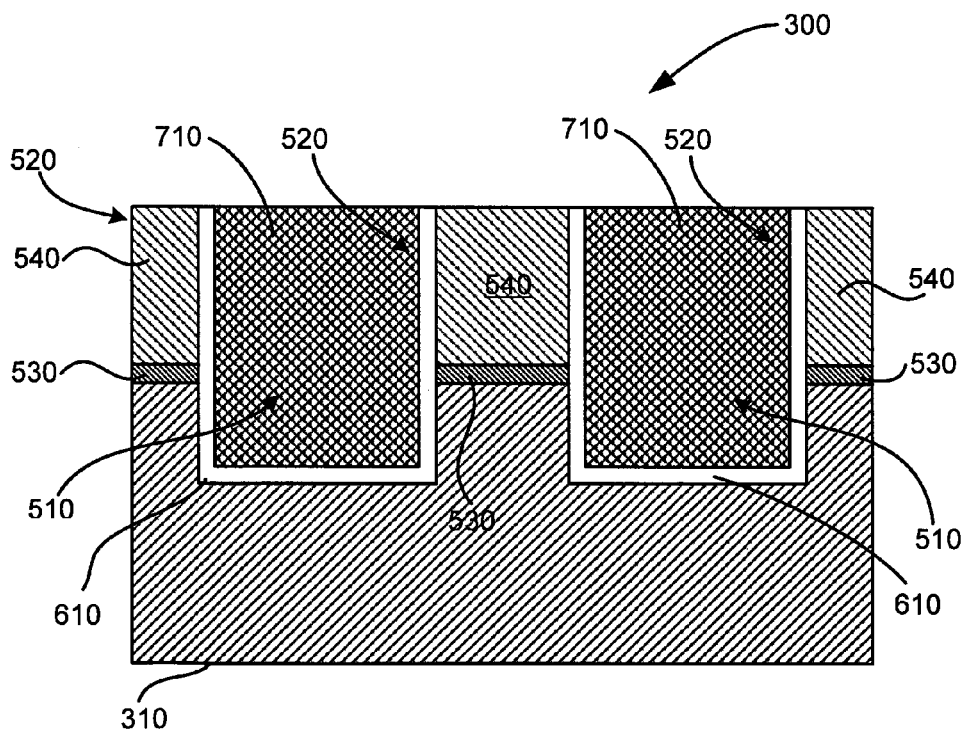
Figure 9:
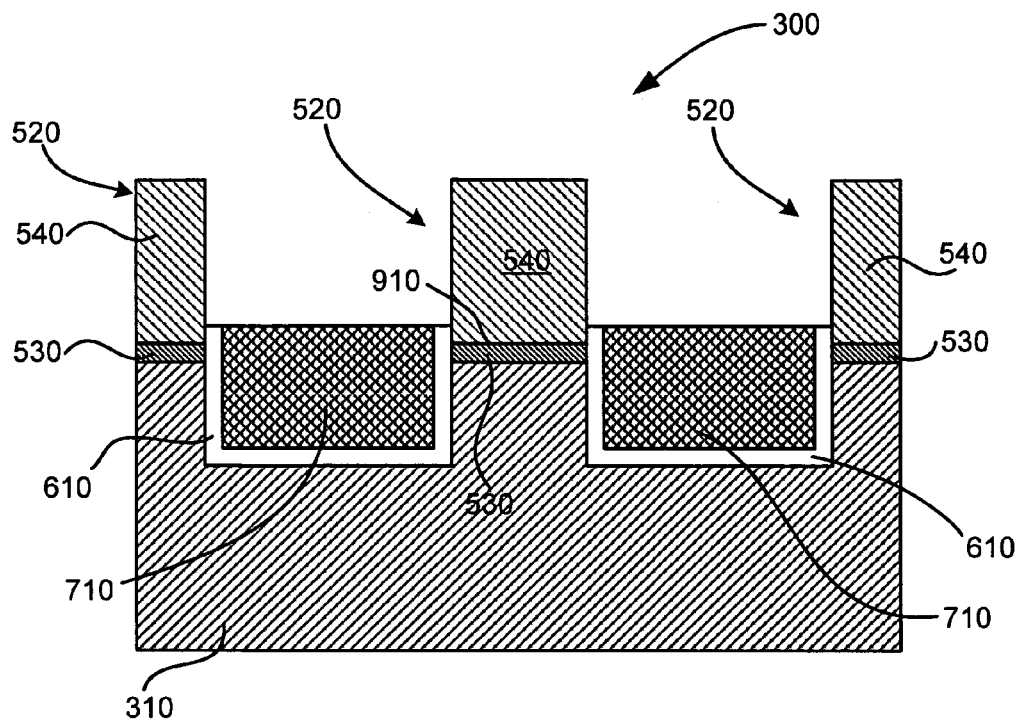

FOX layer 710 may then be planarized using, for example, a chemical mechanical polishing (CMP) process to form a planar top surface within each trench 510 aligned with a top surface of charge storage elements 540, as illustrated in FIG. 8 (act 240). FOX layer 710 may then be etched, in a conventional manner to a predetermined depth within trench 510, as illustrated in FIG. 9 (act 245). In one exemplary implementation, FOX layer 710 may be recessed above an upper surface 910 of tunnel oxide elements 530 and may have a post-etch height ranging from about 600 Å to about 1000 Å, relative to the bottom of trenches 510. In one exemplary implementation, a suitable method for etching FOX layer 710 may be a dry plasma etching that limits the etching to only the FOX material in trench 510.

Figure 10:
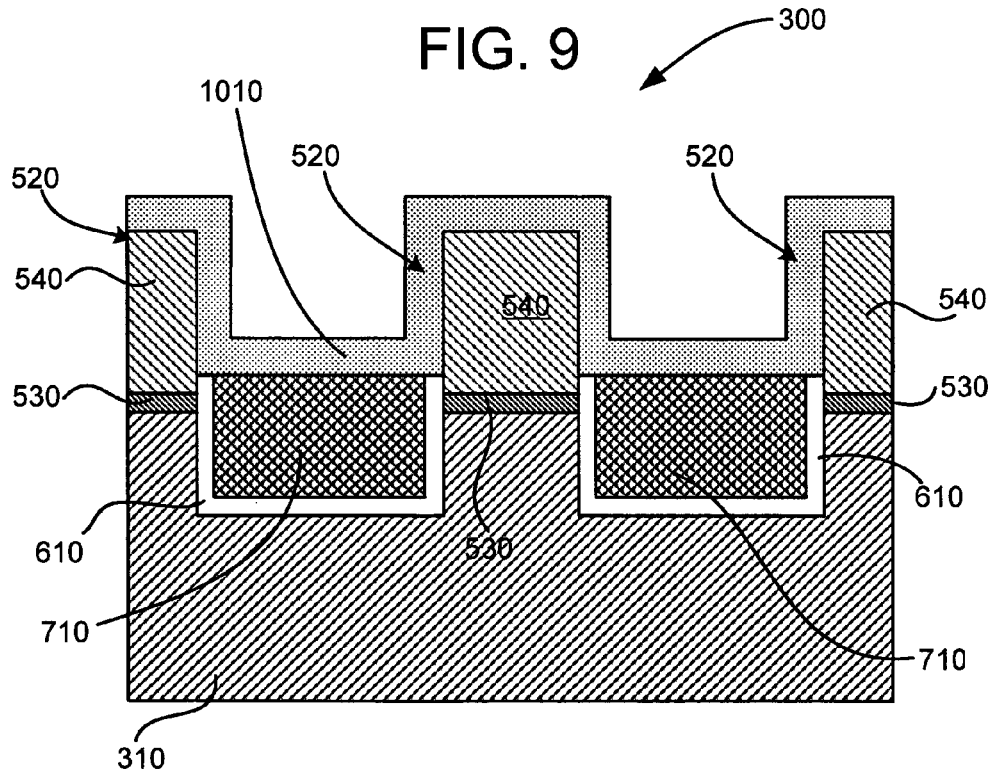

Referring to FIG. 10, an inter-gate dielectric (IGD) layer 1010 may be deposited over the etched FOX layer 710 and charge storage elements 540 in a conventional manner (act 250). In implementations consistent with principles of the invention, IGD layer 1010 may be an oxide/nitride/oxide (ONO) stack, a nitride/oxide (NO) stack, a tantalum oxide (e.g., $Ta_2O_5$), or any suitable dielectric material. In an exemplary implementation, IGD layer 1010 may be an ONO stack have a thickness ranging from about 100 Å to about 300 Å.

Figure 11:
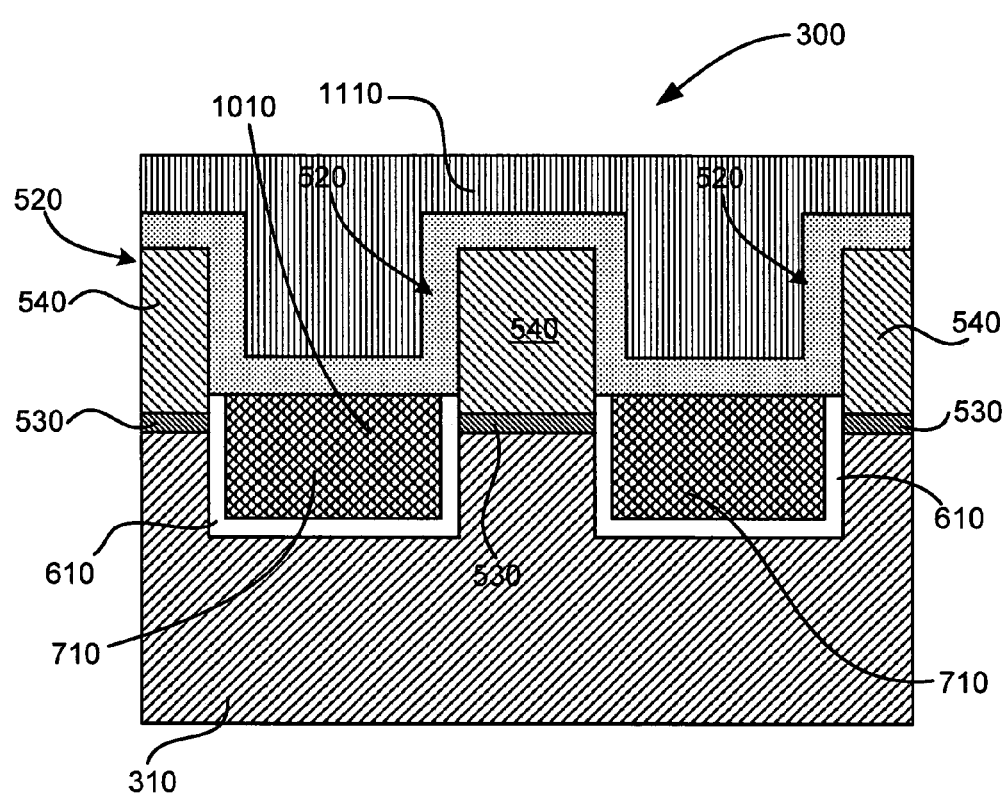

Following IGD layer 1010 formation, a control gate layer 1110 may be formed, on IGD layer 1010 in a conventional manner, as illustrated in FIG. 11 (act 255). In an exemplary implementation, control gate layer 1110 may include a silicon, such as polycrystalline silicon ("polysilicon"), and may have a thickness ranging from about 1000 Å to about 2000 Å. In one implementation consistent with principles of the invention, a suitable method for forming control gate layer 1110 may be chemical vapor deposition (CVD), although suitable alternative deposition techniques may also be employed. Source and drain regions (not shown) may be formed in substrate 310 in a conventional manner.

As illustrated, a semiconductor device is provided with a number of memory cells that each include a tunnel oxide layer, a charge storage element formed over the tunnel oxide layer, an IGD layer formed over the charge storage element, and a control gate layer formed over the IGD layer. In accordance with principles of the invention, each charge storage element may have a height suitable for providing sufficient gate coupling between the floating gate (e.g., element 540) and the control gate (e.g., element 1110). Additionally, neighboring charge storage elements (e.g., polysilicon floating gates 540) may be separated by isolation trenches having a suitable width for reducing or eliminating deleterious cross-coupling noise between the neighboring charge storage elements.

CONCLUSION

The foregoing description of exemplary embodiments of the invention provides illustration and description, but is not intended to be exhaustive or to limit the invention to the precise form disclosed. Modifications and variations are possible in light of the above teachings or may be acquired from practice of the invention. For example, in the above descriptions, numerous specific details are set forth, such as specific materials, structures, chemicals, processes, etc., in order to provide a thorough understanding of the present invention. However, implementations consistent with the invention can be practiced without resorting to the details specifically set forth herein. In other instances, well known processing structures have not been described in detail, in order not to unnecessarily obscure the thrust of the present invention. In practicing the present invention, conventional deposition, photolithographic and etching techniques may be employed, and hence, the details of such techniques have not been set forth herein in detail.

While series of acts have been described with regard to FIG. 2, the order of the acts may be varied in other implementations consistent with the invention. Moreover, non-dependent acts may be implemented in parallel.

No element, act, or instruction used in the description of the present application should be construed as critical or essential to the invention unless explicitly described as such. Also, as used herein, the article "a" is intended to include one or more items. Where only one item is intended, the term "one" or similar language is used. Further, the phrase "based on" is intended to mean "based, at least in part, on" unless explicitly stated otherwise.

What is claimed is:

1. A memory device, comprising:
   a substrate;
   a first dielectric layer formed over the substrate;
   an isolation trench formed in a portion of the substrate and the first dielectric layer;
   at least two charge storage elements formed over the first dielectric layer on opposite sides of the isolation trench;
   a second dielectric layer formed over the at least two charge storage elements; and
   a control gate layer formed over the second dielectric layer,
   where the isolation trench has a width suitable for reducing cross-coupling noise of charge storage elements,
   where the at least two charge storage elements have a height suitable for providing sufficient gate coupling between the at least two charge storage elements and the control gate layer, and
   where a ratio of isolation trench width to charge storage element height ranges from about 20:3 to about 30:1.

2. The memory device of claim 1, where the width of the isolation trench ranges from about 1000 Å to about 3000 Å.

3. The memory device of claim 1, where the at least two charge storage elements comprise polysilicon.

4. The memory device of claim 1, where the height of the at least two charge storage elements ranges from about 30 Å to about 100 Å.

5. The memory device of claim 4, where the width of the at least two charge storage elements ranges from about 500 Å to about 200 Å.

6. The memory device of claim 1, further comprising
   a field oxide layer formed in the isolation trench below the second dielectric layer.

7. The memory device of claim 6, where an upper surface of the field oxide layer is above an upper surface of the first dielectric layer.

8. The memory device of claim 6, where the height of the field oxide layer ranges from about 300 Å to about 900 Å.

9. The memory device of claim 1, where the second dielectric layer comprises an oxide-nitride-oxide stack.

10. The memory device of claim 1, where the control gate layer comprises polysilicon.

11. A memory device, comprising:
a tunnel oxide layer formed over a substrate;
a charge storage layer formed over the tunnel oxide layer; and
an isolation trench formed in a portion of the substrate, the isolation trench forming two charge storage elements on opposite sides of the isolation trench,
where a ratio of isolation trench width to charge storage element height ranges from about 20:3 to about 30:1.

12. The memory device of claim 11, further comprising:
an inter-gate dielectric layer formed over the charge storage elements; and
a control gate layer formed over the inter-gate dielectric layer.

13. The memory device of claim 11, where the charge storage elements comprise a conductive material having a height ranging from about 300 Å to about 900 Å.

* * * * *